(12) United States Patent
Itoh et al.

(10) Patent No.: US 8,893,377 B2
(45) Date of Patent: Nov. 25, 2014

(54) APPARATUS AND METHOD FOR MOUNTING SEMICONDUCTOR LIGHT-EMITTING ELEMENT

(75) Inventors: Tomonori Itoh, Kyoto (JP); Kaori Toyoda, Hyogo (JP); Hiroki Ikeuchi, Osaka (JP); Takeshi Kawabata, Osaka (JP)

(73) Assignee: Panasonic Corporation, Osaka (JP)

( * ) Notice: Subject to any disclaimer, the term of this patent is extended or adjusted under 35 U.S.C. 154(b) by 429 days.

(21) Appl. No.: 13/321,163

(22) PCT Filed: Apr. 26, 2011

(86) PCT No.: PCT/JP2011/002431
§ 371 (c)(1),
(2), (4) Date: Nov. 17, 2011

(87) PCT Pub. No.: WO2011/145278
PCT Pub. Date: Nov. 24, 2011

(65) Prior Publication Data
US 2012/0070917 A1    Mar. 22, 2012

(30) Foreign Application Priority Data

May 19, 2010 (JP) ................................. 2010-114834

(51) Int. Cl.
*H01L 21/67* (2006.01)
*H01L 23/00* (2006.01)

(52) U.S. Cl.
CPC ................. *H01L 24/75* (2013.01); *H01L 24/13* (2013.01); *H01L 24/16* (2013.01); *H01L 24/81* (2013.01); *H01L 2224/753* (2013.01); *H01L 2224/75744* (2013.01); *H01L 2224/75745* (2013.01); *H01L 2224/75801* (2013.01); *H01L 2224/75821* (2013.01); *H01L 2224/759* (2013.01); *H01L 2224/7592* (2013.01); *H01L 2224/81191* (2013.01); *H01L 2224/81201* (2013.01); *H01L 2924/01004* (2013.01); *H01L 2924/01012* (2013.01); *H01L 2924/01079* (2013.01); *H01L 2924/01082* (2013.01); *H01L 2933/0033* (2013.01); *H01L 2924/01005* (2013.01); *H01L 2924/01006* (2013.01); *H01L 2924/01033* (2013.01); *H01L 2924/01055* (2013.01)
USPC ..................... 29/709; 29/740; 29/832; 438/16

(58) Field of Classification Search
CPC .......... H01L 24/75; H01L 24/80; H01L 24/81
USPC ................. 29/739–741, 743; 438/16
See application file for complete search history.

(56) References Cited

U.S. PATENT DOCUMENTS

| 5,027,995 A * | 7/1991 | Karl et al. ..................... 228/111 |
| 7,179,666 B2 | 2/2007 | Kimura et al. |
| 2006/0079008 A1 | 4/2006 | Nishimaki et al. |

FOREIGN PATENT DOCUMENTS

| CN | 1945803 | 4/2007 |
| CN | 101552313 | 10/2009 |

(Continued)

*Primary Examiner* — Livius R Cazan
(74) *Attorney, Agent, or Firm* — Hamre, Schumann, Mueller & Larson, P.C.

(57) ABSTRACT

When bump electrodes 26 of a semiconductor light-emitting element 2 and electrode portions 21 of a mounting board 3 are joined to each other, power is supplied to the electrode portions 21 of the mounting board 3 to allow the semiconductor light-emitting element 2 to emit light, the optical properties of the semiconductor light-emitting element 2 having emitted light are detected, and the detected value of optical properties is processed to obtain the joining state of the bump electrodes 26 of the semiconductor light-emitting element 2 and the electrode portions 21 of the mounting board 3, so that the completion of joining is determined. Thus, the semiconductor light-emitting element can be satisfactorily joined to the electrode portions on the mounting board via the metal electrodes formed on the semiconductor light-emitting element.

16 Claims, 9 Drawing Sheets

(56) References Cited

FOREIGN PATENT DOCUMENTS

| JP | 6-045652 | 2/1994 |
|---|---|---|
| JP | 7-161770 | 6/1995 |
| JP | 9-092699 | 4/1997 |
| JP | 09092699 A * | 4/1997 |
| JP | 11-183406 | 7/1999 |
| JP | 2005-158932 | 6/2005 |
| JP | 2010-034132 | 2/2010 |

* cited by examiner

F I G. 2
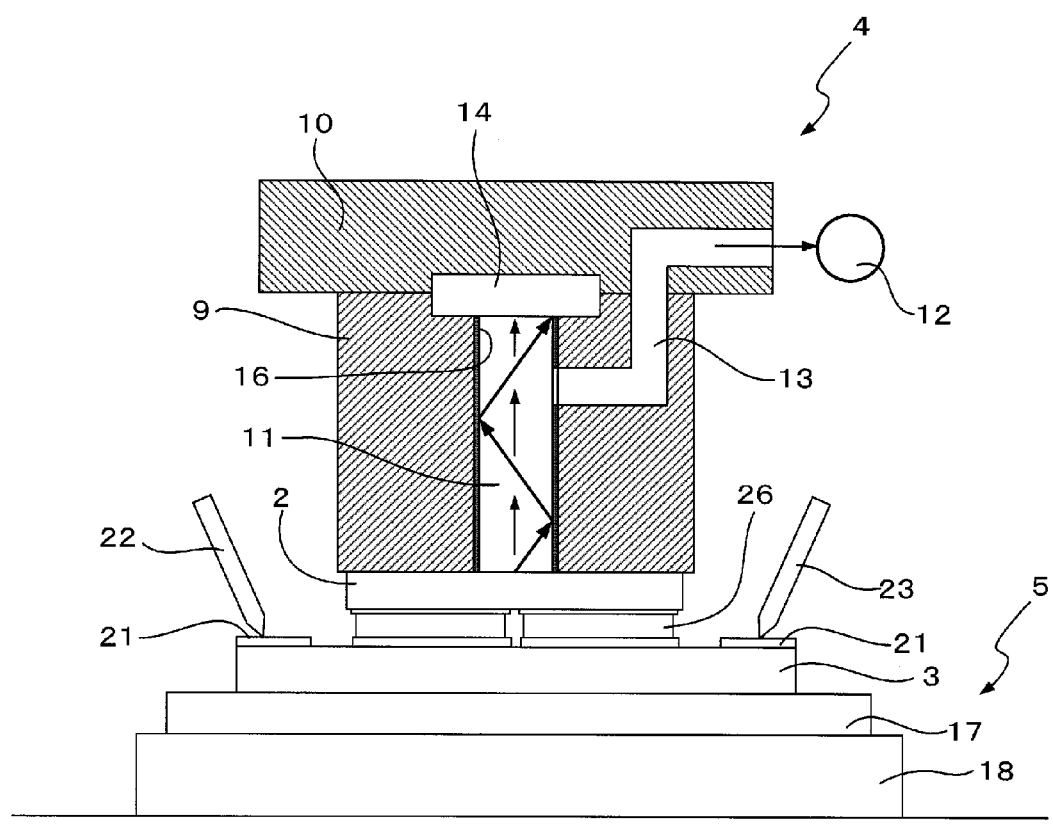

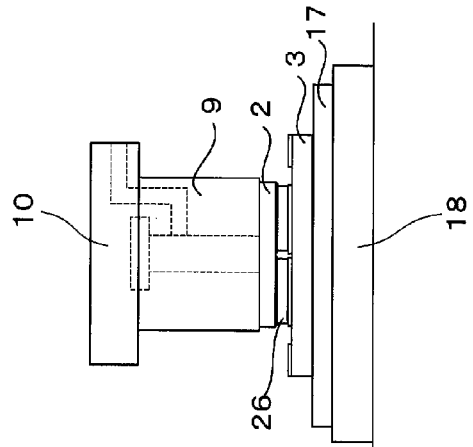
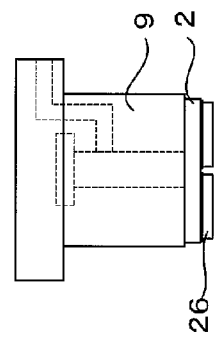
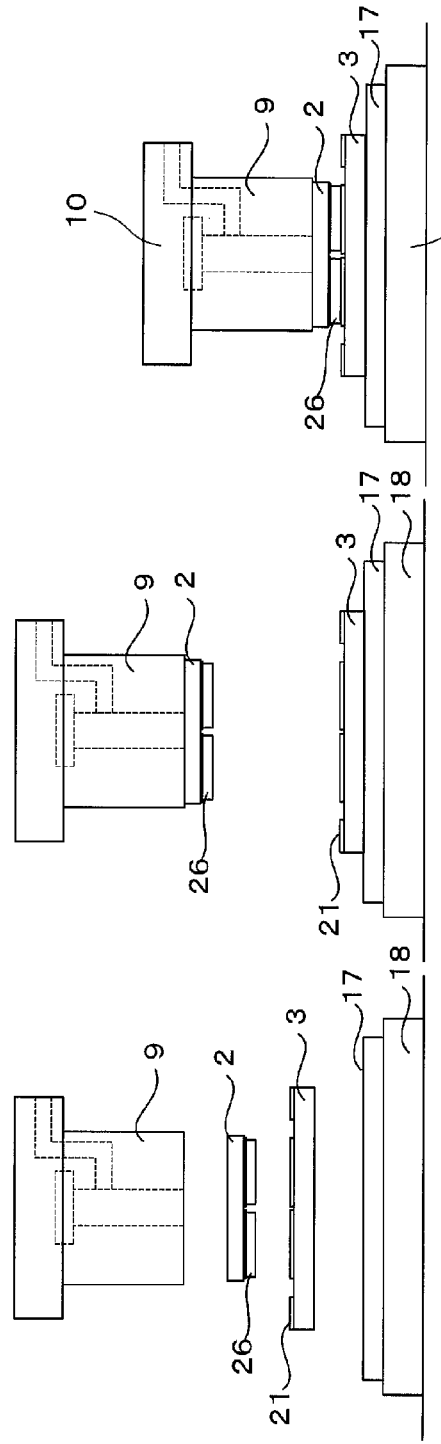
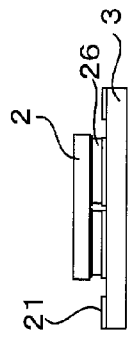
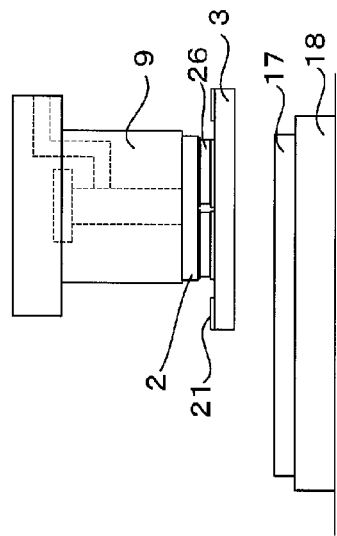

F I G. 9 A
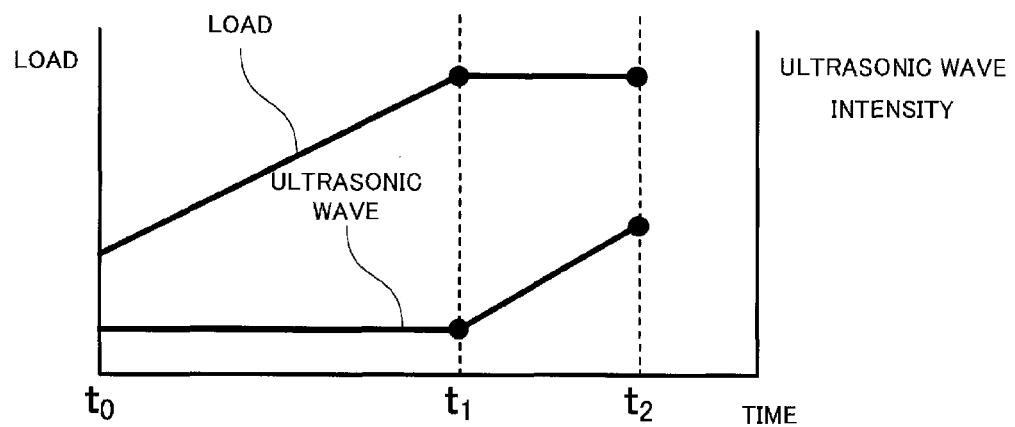
F I G. 9 B
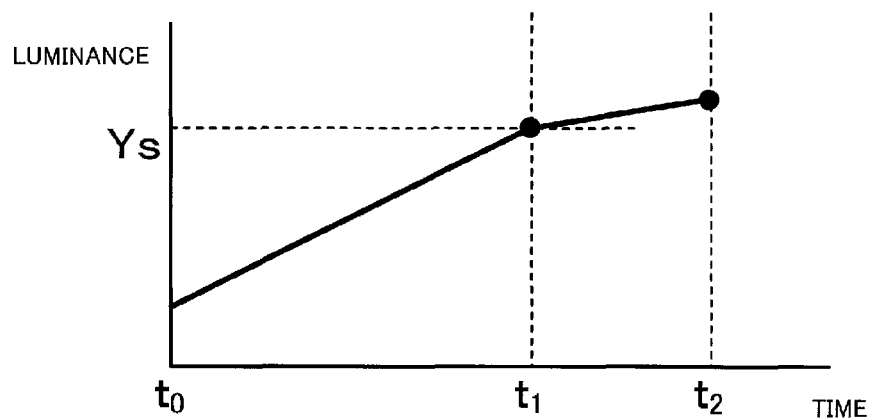
F I G. 9 C
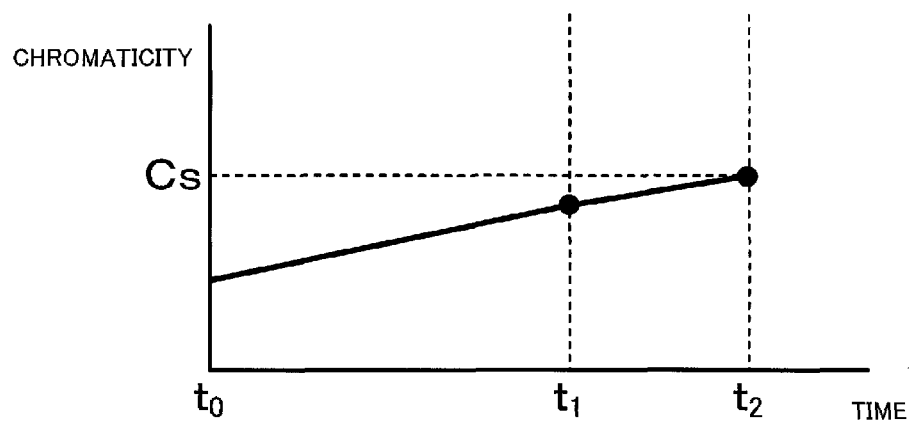

F I G. 1 0   PRIOR ART
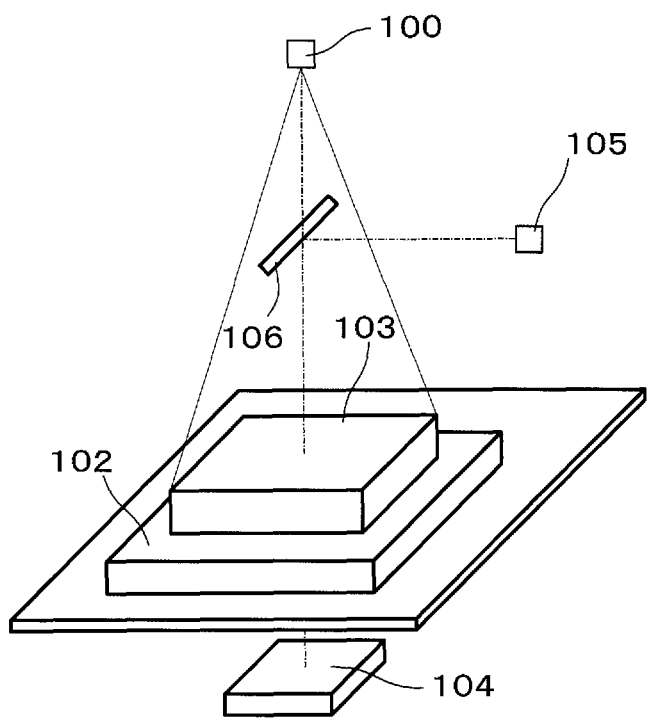

APPARATUS AND METHOD FOR MOUNTING SEMICONDUCTOR LIGHT-EMITTING ELEMENT

TECHNICAL FIELD

The present invention relates to an apparatus and method for mounting a semiconductor light-emitting element on a mounting board.

BACKGROUND ART

In recent years, semiconductor light-emitting elements have been reduced in thickness and rigidity with increasing luminance and efficiency. Further, flip-chip mounting has been adopted as a technique for mounting bare chips of semiconductor light-emitting elements on mounting boards. The flip-chip mounting is a technique for forming a metal electrode on the electrode portion of a semiconductor light-emitting element to electrically join the metal electrode on the semiconductor light-emitting element to a metal electrode on a mounting board.

The process of flip-chip mounting is complicated, so that the joining surface cannot be directly observed. Thus, Patent Literature 1 proposes a technique for bringing a probe needle into direct contact with a semiconductor light-emitting element before flip-chip mounting to evaluate the optical properties and electrical properties of the semiconductor light-emitting element.

Further, Patent Literature 2 proposes a technique for performing evaluations on a semiconductor element and a mounting board after flip-chip mounting using X-ray equipment or an infrared microscope. The inspection device is configured as shown in FIG. 10.

In FIG. 10, X-rays irradiated from an X-ray generator 100 pass through a flip chip 103 and a circuit board 102, and an X-ray sensor 104 converts the rays to light with the sensor surface to obtain images. The flip chip 103 is flip-chip joined onto the circuit board 102. For the flip-chip joining portion, a heavy metal material such as lead and gold having high X-ray absorption is used. Thus, the flip-chip joining portion is darker than the surrounding in an X-ray image, so that the position of the joining portion can be easily specified. A position level with the underside of the flip chip 103 corresponding to the upper part of the joining portion is measured by a laser focus displacement meter 105. The laser focus displacement meter 105 can measure the position from the side via a mirror 106 allowing the passage of X-rays without affecting the X-ray photography.

Patent Literature 3 describes a die bonding method in which, in the assembly of an optical head, a light-emitting element is electrified to correct a displacement of the light-emitting element.

Patent Literature 4 describes a technique for retaining a light-emitting element by suction before mounting and electrifying the retained light-emitting element to measure the luminance and select the light-emitting element.

Patent Literature 5 describes a technique for mounting a semiconductor element suctioned and retained by a bonding tool on a printed circuit board while detecting the pressing force with the bonding tool.

CITATION LIST

Patent Literatures

Patent Literature 1: Japanese Patent Application Laid-Open Publication No. 2005-158932

Patent Literature 2: Japanese Patent Application Laid-Open Publication No. 11-183406

Patent Literature 3: Japanese Patent Application Laid-Open Publication No. 6-45652

Patent Literature 4: Japanese Patent Application Laid-Open Publication No. 9-92699

Patent Literature 5: Japanese Patent Application Laid-Open Publication No. 7-161770

SUMMARY OF INVENTION

Technical Problem

However, in the technique of Patent Literature 1, only the properties of the semiconductor light-emitting element before mounting can be secured.

Further, in the technique of Patent Literature 2, only the final joining reliability of the semiconductor light-emitting element after mounting can be secured. In other words, the technique of Patent Literature 2 is not designed for securing optical properties and requires the replacement of a semiconductor light-emitting element having defective optical properties. Thus, large amounts of losses may be incurred.

Further, since a typical mounting technique is implemented by open-loop control, joining energy may be applied to a semiconductor light-emitting element although joining has been already completed. Moreover, the mounting step of the semiconductor light-emitting element may be completed in the state of insufficient joining. As a result, cracks in the semiconductor light-emitting element or defects due to damage on a light-emitting layer in the semiconductor light-emitting element may occur.

An object of the present invention is to provide a technique for mounting a semiconductor light-emitting element on a mounting board with higher reliability.

Solution to Problem

A method for mounting a semiconductor light-emitting element according to the present invention includes: supplying power to the electrode portion of a mounting board to allow a semiconductor light-emitting element to emit light while the electrode portion of the semiconductor light-emitting element and the electrode portion of the mounting board are joined to each other; and detecting the optical properties of the semiconductor light-emitting element while the element emits light and controlling the joining of the electrode portion of the semiconductor light-emitting element and the electrode portion of the mounting board based on the detected optical properties.

Further, a method for mounting a semiconductor light-emitting element according to the present invention includes: supplying power to the electrode portion of a mounting board to allow a semiconductor light-emitting element to emit light while the electrode portion of the semiconductor light-emitting element and the electrode portion of the mounting board are joined to each other; and detecting the optical properties of the semiconductor light-emitting element while the element emits light and controlling the joining of the electrode portion of the semiconductor light-emitting element and the electrode portion of the mounting board based on the detected optical properties, wherein the controlling of the joining comprises: controlling the joining with pressing; and then controlling the joining with ultrasonic waves.

A method for mounting a semiconductor light-emitting element according to the present invention includes: supplying power to the electrode portion of a mounting board to allow a semiconductor light-emitting element to emit light while the electrode portion of the semiconductor light-emitting element and the electrode portion of the mounting board are joined to each other; and detecting the optical properties of the semiconductor light-emitting element while the element emits light, and completing the joining when detecting that the chromaticity of the optical properties falls within a prescribed chromaticity range and the luminance of the optical properties reaches at least prescribed luminance.

An apparatus for mounting a semiconductor light-emitting element according to the present invention includes: a pressing mechanism including a suction hole for suctioning a semiconductor light-emitting element, for pressing the suctioned semiconductor light-emitting element; a stage holding a mounting board; a power supply unit for supplying power to the electrode portion of the mounting board held by the stage; an optical property detector for detecting the optical properties of light from the suction hole; and a processing control unit for controlling the pressing of the pressing mechanism based on a value detected by the optical property detector.

Further, an apparatus for mounting a semiconductor light-emitting element according to the present invention includes: a pressing mechanism including a suction hole for suctioning a semiconductor light-emitting element, for pressing the suctioned semiconductor light-emitting element; an ultrasonic-wave-applying mechanism for applying ultrasonic waves to the semiconductor light-emitting element; a stage holding a mounting board; a power supply unit for supplying power to the electrode portion of the mounting board held by the stage; an optical property detector for detecting the optical properties of light from the suction hole; and a processing control unit for controlling the pressing of the pressing mechanism or the ultrasonic waves applied by the ultrasonic-wave-applying mechanism based on a value detected by the optical property detector.

Moreover, an apparatus for mounting a semiconductor light-emitting element according to the present invention includes: a pressing mechanism including a suction hole for suctioning a semiconductor light-emitting element and an optical waveguide disposed along the inner circumference of the suction hole, for pressing the suctioned semiconductor light-emitting element; a stage holding a mounting board; a power supply unit for supplying power to the electrode portion of the mounting board held by the stage; a first optical property detector for detecting the optical properties of light from the suction hole; a second optical property detector for detecting the optical properties of light from the optical waveguide; and a processing control unit for controlling the pressing of the pressing mechanism based on values detected by the first optical property detector and the second optical property detector.

Advantageous Effects of Invention

According to the present invention, the electrode of a semiconductor light-emitting element and the electrode portion of a mounting board can be joined to each other stably and satisfactorily, so that the semiconductor light-emitting element can be mounted on the mounting board with higher reliability.

BRIEF DESCRIPTION OF DRAWINGS

FIG. 2 is a cross-sectional view showing the main part of a head and the periphery thereof according to the first embodiment.

FIG. 3A shows a first step according to the first embodiment. FIG. 3B shows a second step according to the first embodiment. FIG. 3C shows a third step according to the first embodiment. FIG. 3D shows a fourth embodiment according to the first embodiment. FIG. 3E shows a fifth embodiment according to the first embodiment.

FIG. 9A-C are detected signal waveform diagrams of the main part of the apparatus for mounting a semiconductor light-emitting element according to the third embodiment.

FIG. 10 is a configuration diagram showing a mounting apparatus according to the related art.

DESCRIPTION OF EMBODIMENTS

Embodiments of the present invention will be described below in accordance with the accompanying drawings.

First Embodiment

Figure 1:
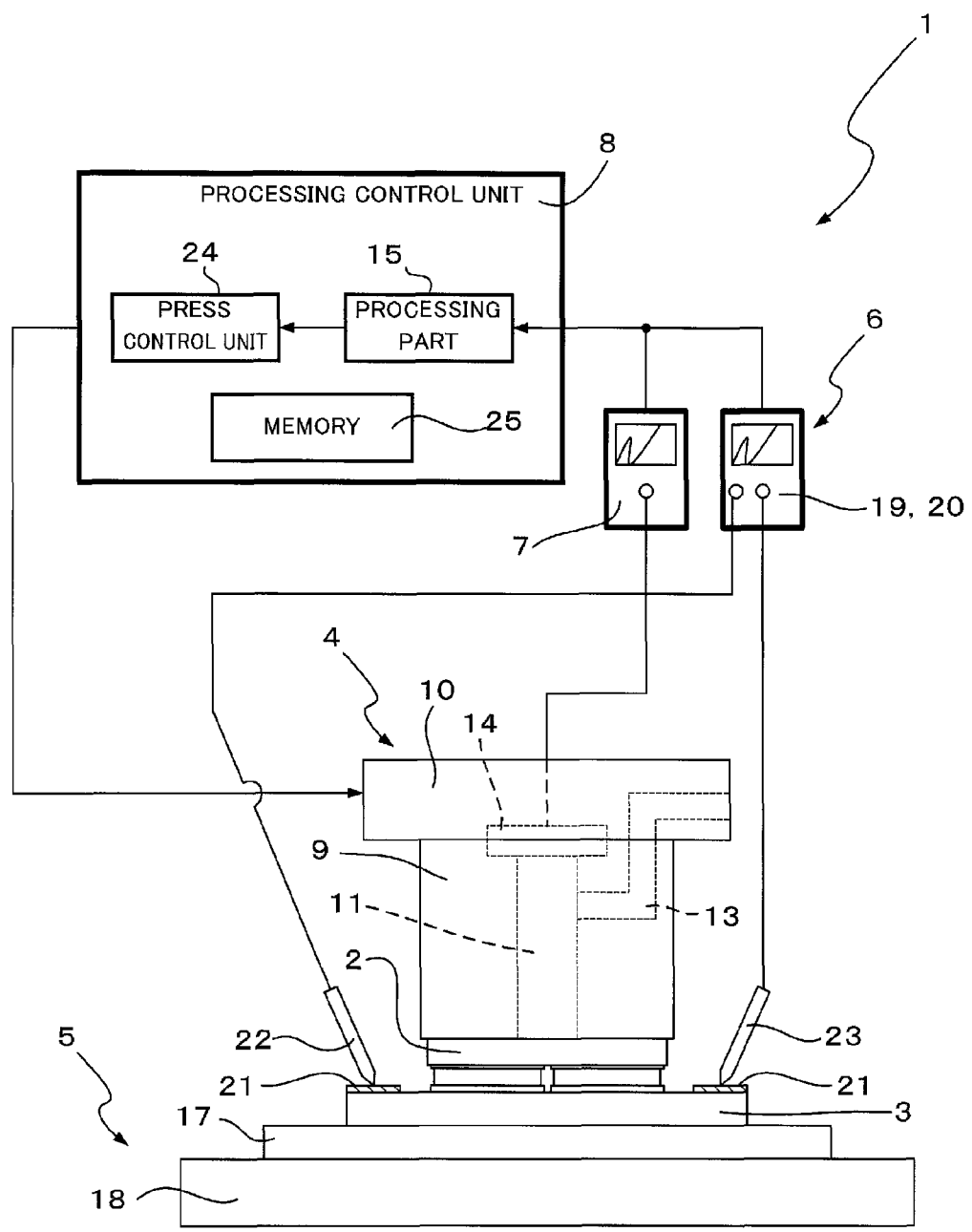
FIG. 1 is a configuration diagram showing an apparatus for mounting a semiconductor light-emitting element according to a first embodiment of the present invention.

FIG. 1 is a configuration diagram showing an apparatus for mounting a semiconductor light-emitting element according to a first embodiment of the present invention. FIG. 2 is an enlarged cross-sectional view showing the main part of a head and the periphery thereof according to the first embodiment. FIGS. 3A to 3E show first to fifth steps according to the first embodiment. FIG. 2 shows the cross sections of a pressing mechanism 9 and a moving mechanism 10 only in a head 4. FIG. 3A shows a mounting board 3, a semiconductor light-emitting element 2 and the peripheral parts thereof holding the mounting board and semiconductor light-emitting element from above and below. The mounting board, the semiconductor light-emitting element, and the peripheral parts are vertically illustrated at intervals.

A mounting apparatus 1 of FIG. 1 includes the head 4, a stage 5, a power feeder 6, an optical property measuring part 7, and a processing control unit 8. The head 4 retains the semiconductor light-emitting element 2 with bump electrodes 26 as an electrode portion, as shown in FIG. 3B. On the stage 5, the mounting board 3 is placed on which the semiconductor light-emitting element 2 is to be mounted. The power feeder 6 supplies power to the semiconductor light-emitting element 2 while mounting. The optical property measuring part 7 measures the optical property value of the semiconductor light-emitting element 2 while mounting. The processing control unit 8 controls operations of the mounting apparatus 1.

As shown in FIG. 2, the head 4 includes the pressing mechanism 9 and the moving mechanism 10. The pressing mechanism 9 presses the retained semiconductor light-emitting element 2 down. The moving mechanism 10 moves the pressing mechanism 9 to a predetermined mounting position of the mounting board 3. The pressing mechanism 9 is cylindrically-shaped with a suction hole 11 formed therein. The diameter of the pressing mechanism 9 is 1.0 times to 1.5 times as large as the diagonal diameter of the semiconductor light-emitting element 2. The diameter of the suction hole 11 is not smaller than 0.05 mm and not more than 0.2 times as large as the diagonal diameter of the semiconductor light-emitting element 2. The diagonal diameter of the semiconductor light-emitting element 2 is typically about 0.3 mm to 1.0 mm.

A suction passage 13 communicating with a negative-pressure source 12 is connected to the suction hole 11. The semiconductor light-emitting element 2 is retained via the suction hole 11 and the suction passage 13 by the suctioning of the negative-pressure source 12.

As shown in FIG. 2, an optical property detector (first optical property detector) 14 is provided at the terminal end of the suction hole 11 opening at the distal end of the pressing mechanism 9. The optical property detector 14 detects light having entered the suction hole 11. Further, the optical property detector 14 sends intensity information according to the wavelength unit of the detected light to a processing part 15 of the processing control unit 8 via the optical property measuring part 7. The inner circumferential surface (surface) of the suction hole 11 is coated with a coating material 16 with a low refractive index which reflects or propagates light with high efficiency. The coating material 16 guides light having entered the suction hole 11 to the optical property detector 14 at a low attenuation rate with high efficiency. The coating material 16 enables the optical property detector 14 to detect even weak light having entered the suction hole 11. The coating material 16 is preferably $SiO_2$ and $MgF_2$ both having a refractive index of about 1.5. Further, the inner circumferential surface (surface) of the suction hole 11 may be mirror-finished. The inner circumferential surface of the suction hole 11 (surface of optical waveguide) having been mirror-finished can easily form a reflecting surface with slightly reduced reflectivity.

The stage 5 includes a mounting board holder 17 and a moving mechanism 18. The mounting board holder 17 holds the placed mounting board 3 by suction. The moving mechanism 18 moves the mounting board holder 17 in a horizontal plane.

The power feeder 6 includes a DC power supply 19 for supplying electric power, a probe 22, a voltage measuring device 20 for measuring a voltage, and a probe 23. The probe 22 contacts an electrode portion 21 on the mounting board 3 to electrically connect the DC power supply 19 and the electrode portion 21. The probe 23 contacts another electrode portion 21 on the mounting board 3 to electrically connect the voltage measuring device 20 and the electrode portion 21.

The optical property measuring part 7 performs processing on an output from the optical property detector 14 and sends the output to the processing part 15 of the processing control unit 8.

The processing control unit 8 has a circuit for performing calculations and drive circuits. The processing control unit 8 controls the head 4, the stage 5, the power feeder 6, and the optical property measuring part 7. FIG. 1 shows only the processing part 15, a press control part 24, and a memory 25 as the constituents of the main part of the processing control unit 8. The processing part 15 performs processing on a measured value from the optical property measuring part 7. The press control part 24 controls the force of the pressing mechanism 9. The memory 25 stores data and so on for determining a threshold value $\Phi_{th}$.

Figure 4:
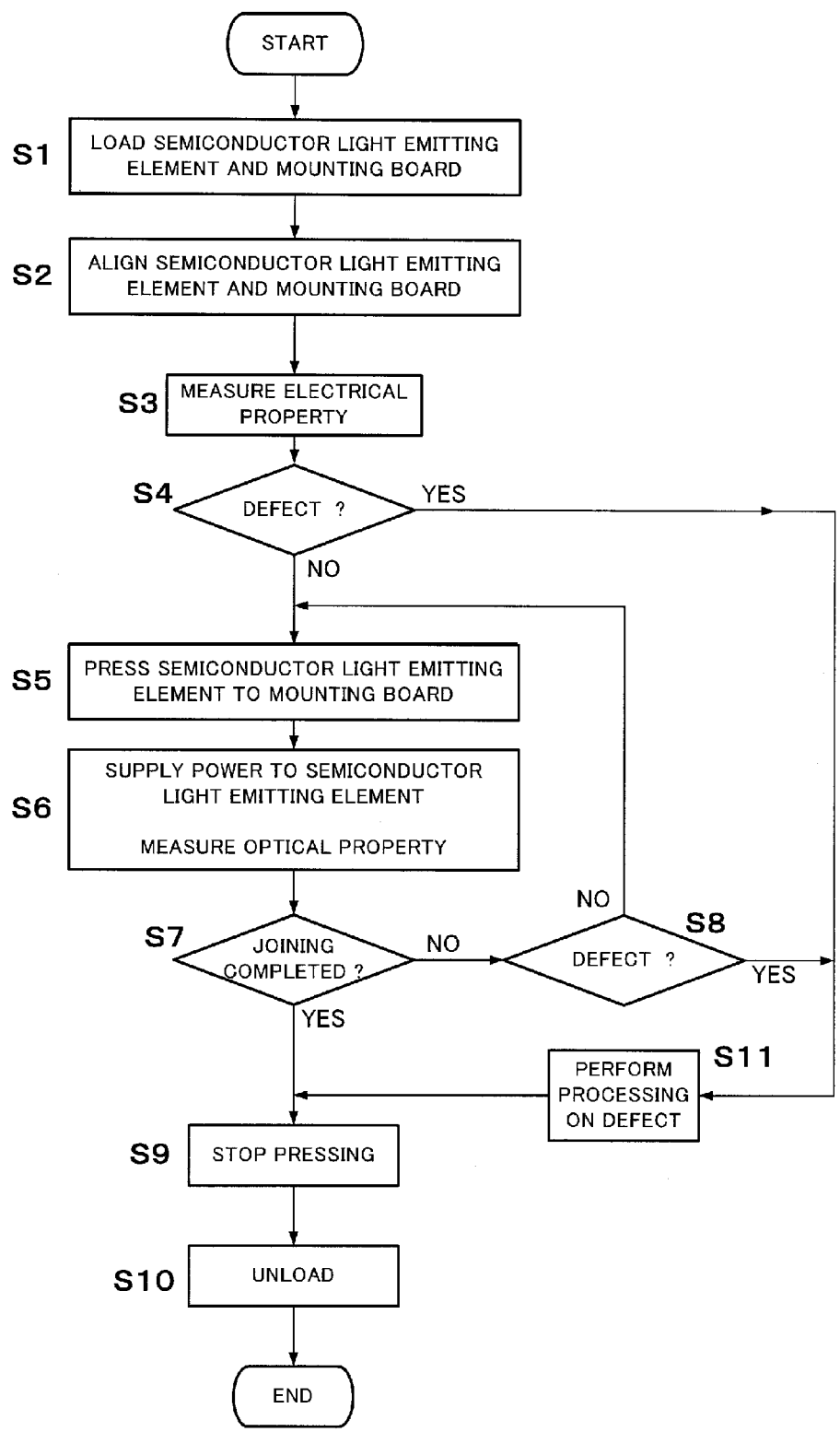
FIG. 4 is a flowchart of processing control according to the first embodiment.

The following will describe the specific configuration of the processing control unit 8 with reference to the flowchart of FIG. 4.

In step S1, as shown in FIG. 3B, the semiconductor light-emitting element 2 is suctioned and retained by the pressing mechanism 9 of the head 4. Further, the mounting board 3 is suctioned and retained on the mounting board holder 17. In other words, the semiconductor light-emitting element and the mounting board are loaded.

In step S2, as shown in FIG. 3C, the moving mechanisms 10 and 18 move the semiconductor light-emitting element 2 and the mounting board 3 to a predetermined mounting position, and the semiconductor light-emitting element 2 and the mounting board 3 are aligned.

In step S3, as shown in FIG. 2, the probes 22 and 23 contact the electrode portions 21 on the mounting board 3, and the DC power supply 19 and the voltage measuring device 20 measure an electrical property value of the mounting board 3. The electrical property value indicates a physical quantity such as an impedance value and capacitance.

In step S4, based on the measurement result in step S3, it is determined whether or not defects such as an electrode short are caused on the mounting board 3. When defects are detected in step S4 (in the case of "YES" in response to the question "defect?" in step S4), the process advances to step S11 which will be described later.

When it is confirmed that there are no defects in step S4 (in the case of "NO" in response to the question "defect?" in step S4), the routine of step S5 to step S8 is repeated until the completion of joining is determined in step S7.

In step S5, the press control part 24 controls the pressing mechanism 9 to press the semiconductor light-emitting element 2 toward the mounting board 3.

In step S6, while the semiconductor light-emitting element 2 continues to be pressed (during the pressing of step S5), the power feeder 6 supplies electric power to the semiconductor light-emitting element 2, so that the semiconductor light-emitting element 2 emits light. Further, in step S6, concurrently with the light-emitting of the semiconductor light-emitting element 2, the optical property detector 14 measures the optical property value of the mounting board 3. The optical property value indicates a physical quantity such as luminance and chromaticity.

In step S7, based on the measurement result in step S6, the processing part 15 determines the completion of joining.

Specifically, the processing part 15 compares the optical property value measured by the optical property measuring part 7 with the threshold value $\Phi_{th}$ stored in the memory 25, and determines the completion of joining when the measurement result exceeds the threshold value $\Phi_{th}$. The threshold value $\Phi_{th}$ will be specifically described in accordance with FIG. 5.

Figure 5:
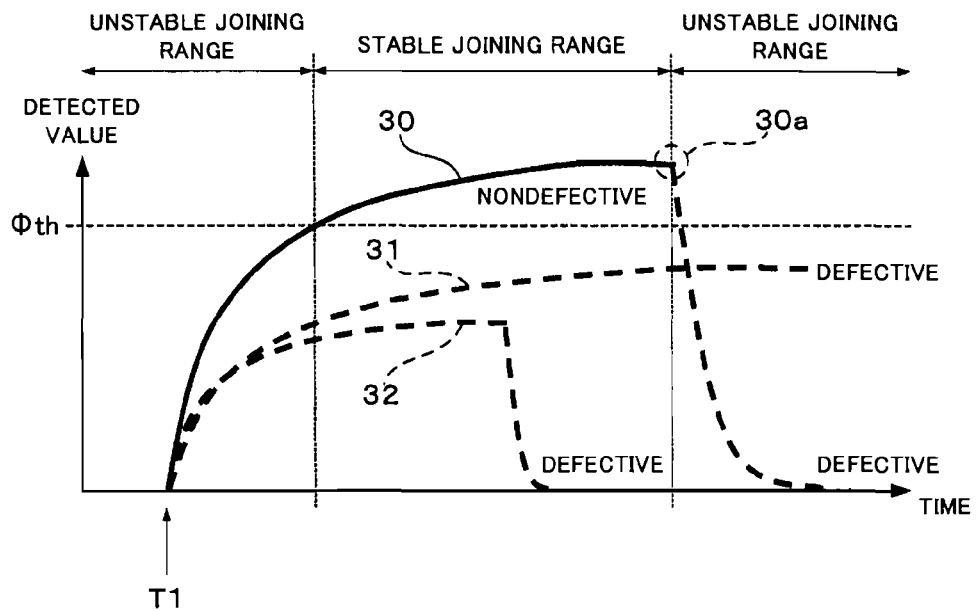
FIG. 5 is a relationship diagram of a detected optical property value and a mounting condition.

FIG. 5 shows the transition of the optical property value when the bump electrodes 26 of the semiconductor light-emitting element 2 continued to be pressed to the electrode portions 21 on the mounting board 3 at a constant pressure. The time when the bump electrodes 26 of the semiconductor light-emitting element 2 come into contact with the electrode portions 21 on the mounting board 3 is indicated by T1. It is noted from FIG. 5 that the optical property value of the light-emitting portion of the semiconductor light-emitting element 2 had increased for a while after T1, and thereafter had been kept virtually constant. The optical property value of the light-emitting portion of the semiconductor light-emitting element 2 had increased and thereafter had been kept virtually constant, no matter whether the joining was defective or not.

Even when the joining was nondefective (in the case of 30 in FIG. 5), after the bump electrodes 26 continued to be pressed at the constant pressure, redundant energy caused damage on the light-emitting portion of the semiconductor light-emitting element 2, the short or open of the bump electrodes 26, or cracks on the light-emitting portion in some cases. At a point of 30a of FIG. 5, the light-emitting portion cracked. When the joining was defective (in the cases of 31 and 32 in FIG. 5, even when the bump electrodes 26 of the semiconductor light-emitting element 2 continued to be pressed to the electrode portions 21 of the mounting board 3 at the constant pressure, the optical property value of the mounted semiconductor light-emitting element 2 did not reach the threshold value $\Phi_{th}$.

Since the optical property value reached at least the constant value ($\Phi_{th}$ in FIG. 5) in the case of nondefective mounting, the optical property value of the mounted semiconductor light-emitting element 2 can be determined with reference to the threshold value $\Phi_{th}$, so that the joining state during mounting can be determined without destruction.

In step S7, when it is determined that the joining is uncompleted (in the case of "NO" in response to the question "joining completed?" in step S7), the process advances to step S8. In step S8, the processing part 15 determines whether or not defects occur on the joining, the process returns to step S5 when it is determined that there are no defects (in the case of "NO" in response to the questions "defect?" in step S8), and steps S5 to S7 are performed.

When the completion of joining is determined in step S7 (in the case of "YES" in response to the question "joining completed?" in step S7), step S9 is performed.

In step S9, the processing part 15 sends a notification signal of completion of joining to the press control part 24. The press control part 24 having received the signal stops the pressing mechanism 9 from pressing the semiconductor light-emitting element 2.

Subsequently in step S10, as shown in FIG. 3D, in a state where the suction and retention of the mounting board 3 by the mounting board holder 17 are released, the head 4 is elevated and the mounting board 3 with the semiconductor light-emitting element 2 is unloaded. The mounting board 3 is unloaded and the suction and retention of the semiconductor light-emitting element 2 by the pressing mechanism 9 is released, so that the mounting of the semiconductor light-emitting element 2 is completed as shown in FIG. 3E.

In step S8, for example, in the case where the optical property value of the semiconductor light-emitting element 2 does not exceed the threshold value $\Phi_{th}$ despite the pressing for a certain period of time (in the case of "YES" in response to the question "defect?" in step S8), the process advances to step S11. At this point, in response to "YES" to the question "defect?" in step S8, it is determined that defects occur which include cracks or damage on the light-emitting portion of the semiconductor light-emitting element 2 and the short or open of the bump electrodes 26. In step S11, a notification signal of defects is sent to the press control part 24. The press control part 24 having received the notification signal in step S11 stops the pressing mechanism 9 from pressing the semiconductor light-emitting element 2 in step S9.

As described above, in the mounting apparatus 1 of the first embodiment, during the pressing step of joining the semiconductor light-emitting element 2 to the mounting board 3, the optical property measuring part 7 measures the optical property value of the semiconductor light-emitting element 2. Then, based on the measured optical property value, it is determined whether or not the joining of the semiconductor light-emitting element 2 and the mounting board 3 is completed. This prevents the joining operation from being completed despite an inadequate optical property value, so that stable joining strength and optical properties can be obtained.

Further, the joining operation can be prevented from being excessively performed despite an adequate optical property value. Thus, the occurrence of cracks or damage on the light-emitting portion of the semiconductor light-emitting element 2 and defects on the bump electrodes 26 (short, open and so on) can be suppressed.

Figure 6:
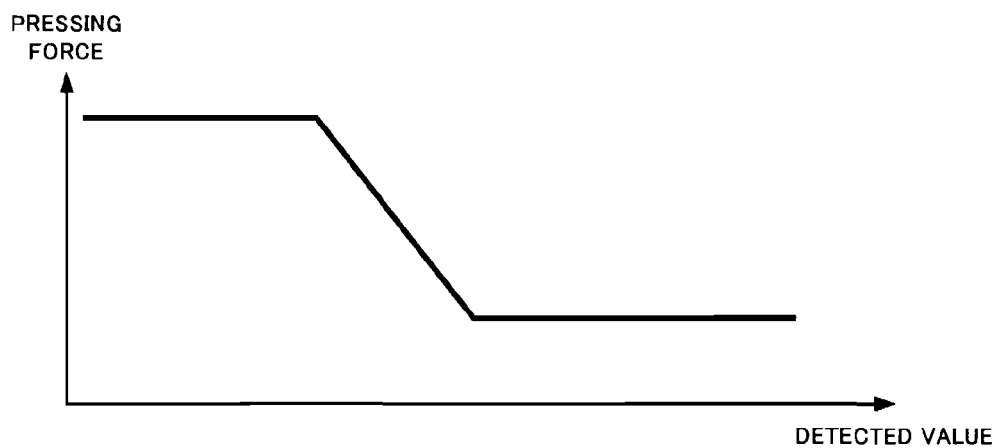
FIG. 6 is a chart showing an example of controlling a pressing force according to the first embodiment.

In the first embodiment, the timing of completion of pressing is controlled according to the detected optical property value. The present invention is not limited to this point. In other words, in addition to the timing of completion of pressing, any parameter of the pressing may be controlled according to the detected optical property value in real time. An example of the parameter to be controlled is the pressing force in the pressing step. FIG. 6 shows an example of controlling the pressing force according to the detected optical property value. FIG. 6 shows the example in which the pressing force is increased while the detected optical property value is low, and the pressing force is reduced with an increase in the detected optical property value. In this case, data showing the relationship between the optical property value and the pressing force as shown in FIG. 6 is beforehand stored in the memory 25 as data for determination. Based on the data for determination, the processing part 15 may send a control signal to the press control part 24 according to the pressing force. As a matter of course, the example of controlling the pressing force in FIG. 6 is one example among many, and appropriate control may be performed according to actual mounting conditions.

In the present embodiment, the optical property detector 14 is provided in the pressing mechanism 9 to reduce the size of the apparatus. The present invention, however, is not limited to this configuration. For example, the optical property detector 14 may be provided on the exterior of the pressing mechanism 9 to guide light incident through the suction hole 11 to the optical property detector 14 by an optical fiber and so on.

Second Embodiment

Figure 7:
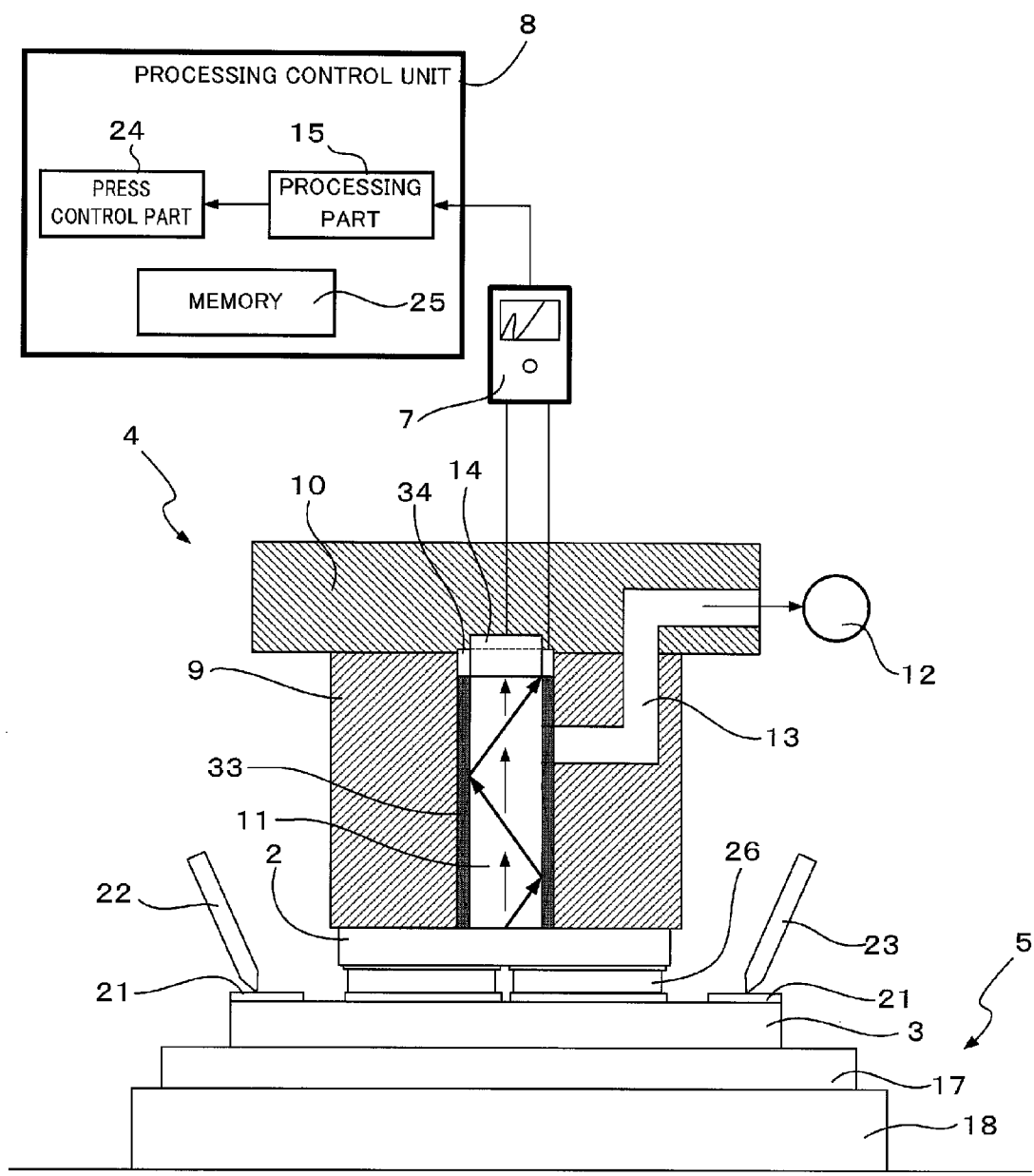
FIG. 7 is a configuration diagram showing the main part of an apparatus for mounting a semiconductor light-emitting element according to a second embodiment of the present invention.
Figure 8:
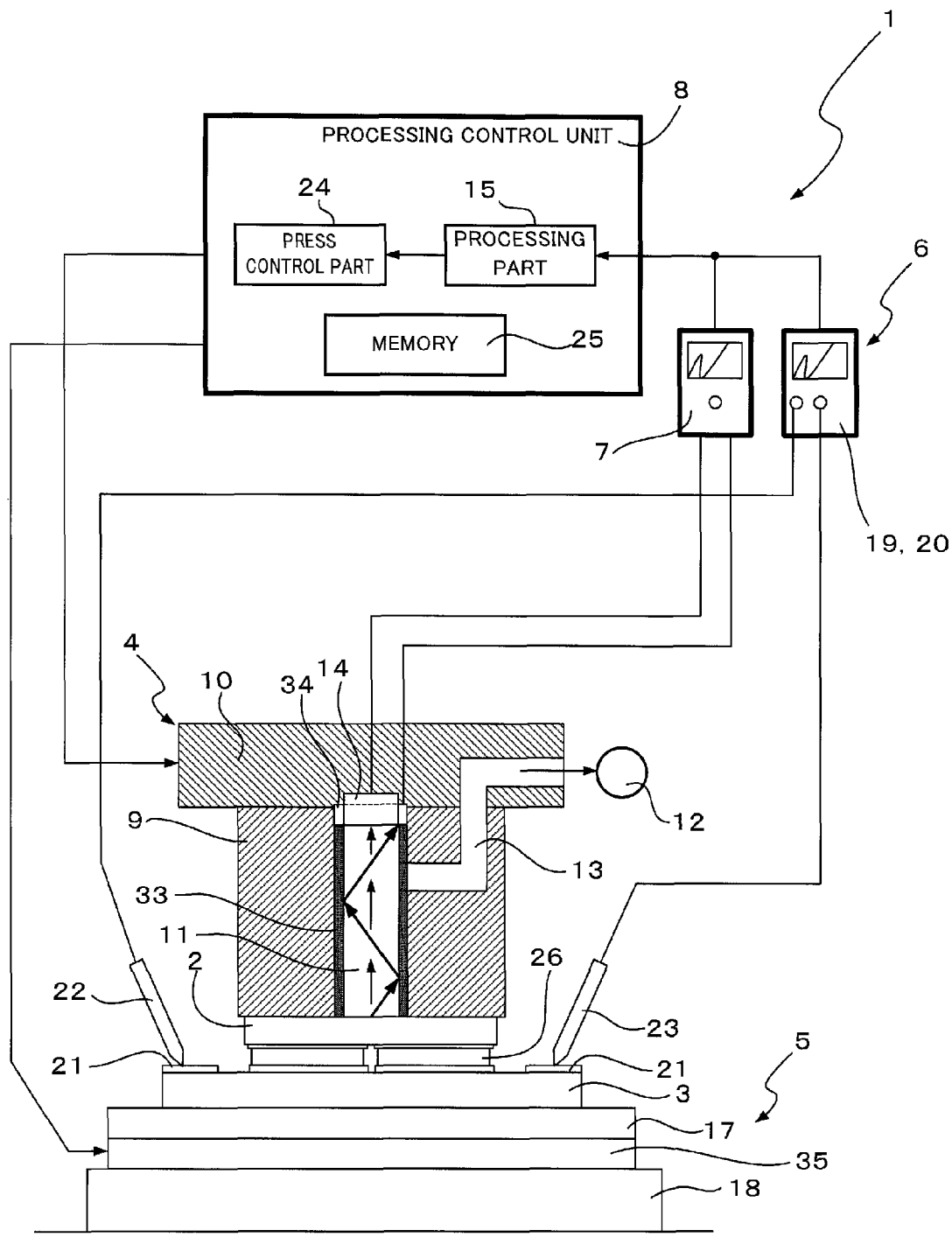
FIG. 8 is a configuration diagram showing an apparatus for mounting a semiconductor light-emitting element according to a third embodiment of the present invention.

FIG. 7 is a configuration diagram showing the main part of an apparatus for mounting a semiconductor light-emitting element according to a second embodiment of the present invention. In the first embodiment, the suction hole 11 is an air passage, the optical property detector 14 detects light propagated through the passage, and the processing control unit 8 controls the pressing force of joining via the optical property measuring part 7. However, the propagation frequency characteristics of the suction hole 11 are affected by the reflection characteristics of the coating material 16. Thus, in order that the processing control unit 8 controls the pressing force of joining by measuring luminance in a wide range of chromaticity, it is desirable that the propagation frequency characteristics of the detected light be further flattened.

In the second embodiment, a plurality of optical fibers 33 are circularly arranged along the inner circumferential surface of a suction hole 11. The optical fiber 33 is an optical waveguide having a core material which includes a distal end positioned on the suction hole 11 on the side of a semiconductor light-emitting element 2 and another end positioned on the side of an optical property detector 14. Further, in the second embodiment, in addition to the optical property detector 14, another optical property detector 34 is provided. Light having propagated through the core materials of the optical fibers 33 is detected by the optical property detector 34. In this case, the optical property detector 14 detects only light propagated through an air passage surrounded by the circularly-arranged optical fibers 33. The outer peripheral surface of the optical fiber 33 may be coated by a coating material 16.

An output detected by the optical property detector 14 (hereinafter, will be referred to as the first detected output) and an output detected by the other optical property detector 34 (hereinafter, will be referred to as the second detected output) are inputted to a processing control unit 8 through an optical property measuring part 7. Specifically, the optical property measuring part 7 is a spectrometer for measuring and outputting light intensity for each frequency.

The first detected output and the second detected output inputted through the optical property measuring part 7 to the processing control unit 8 are weighted in a processing part 15 such that the weighted outputs have the same ratio per unit area even when the optical property detector 14 and the other optical property detector 34 are different in incidence area. After the outputs are thus weighted such that the weighted outputs have the same ratio per unit area, the first detected output and the second detected output are added and outputted to a press control part 24.

The weighting in the processing part 15 will be specifically described. The first detected output is denoted by A1, the incidence area of the optical property detector 14 is denoted by N1, the second detected output is denoted by A2, and the incidence area of the other optical property detector 34 is denoted by N2. In this case, the output from the processing part 15 is represented, for example, as follows:

$$A1 \cdot N2 + A2 \cdot N1$$

In the second embodiment, other numeral values and calculations are the same as those in the first embodiment, and an explanation thereof is omitted.

In the second embodiment, with this configuration, the frequency properties of a detected signal inputted through the optical property measuring part 7 to the processing control unit 8 can be more flattened than in the first embodiment. Thus, it is possible to achieve a mounting condition in which variations in luminance and chromaticity are reduced.

Third Embodiment

FIGS. 8 and 9A-C show an apparatus for mounting a semiconductor light-emitting element according to a third embodiment of the present invention.

In the following explanation, an example of a semiconductor light-emitting element is backlight for illuminating a liquid crystal display panel from behind. Backlighting requires a large number of light-emitting elements emitting white light to be vertically and horizontally mounted at predetermined intervals. Backlighting also requires few variations in brightness and luminescent color between the adjacent light-emitting elements.

The following will discuss why variations occur in brightness and luminescent color.

Bump electrodes formed on the electrode portion of the light-emitting element are pressed to electrode portions 21 of a mounting board 3 to be mounted on the mounting board 3. Even when there are no variations in the brightness and luminescent color of the light-emitting elements before pressing the bump electrodes to be mounted, variations in pressing force lead to variations in the deformed conditions of the bump electrodes 26, resulting in variations in the contact area of the bump electrodes 26 with the electrode portions 21.

Specifically, when the contact area of the bump electrodes 26 with the electrode portions 21 is large, heat generated from the light-emitting element by electric conduction is satisfactorily conducted to the electrode portions 21 via the bump electrodes 26. On the other hand, when the contact area of the bump electrodes 26 with the electrode portions 21 is small, heat generated from the light-emitting element by electric conduction is insufficiently conducted to the electrode portions 21 via the bump electrodes 26. Thus, when the contact area is small, the temperature of the light-emitting element increases and the brightness decreases with the passage of conduction time.

Further, even when the contact area of the bump electrodes 26 with the electrode portions 21 is constant, the chromaticity of the luminescent color slightly fluctuates depending on the condition of the interfaces between the bump electrodes 26 and the electrode portions 21.

In response, in the third embodiment, the chromaticity is brought closer to the target chromaticity, in addition to bringing the luminance closer to the target luminance. Thus, in the third embodiment, below the mounting board 3 and between a mounting board holder 17 and a moving mechanism 18, an ultrasonic-wave-applying mechanism 35 is interposed. Further, a processing control unit 8 performs control as shown in FIG. 9A. Other configurations are the same as in the second embodiment, and an explanation thereof is omitted.

In FIG. 9A, the abscissa indicates time, the left ordinate indicates a load applied when a semiconductor light-emitting element 2 is pressed toward the mounting board 3 by a pressing mechanism 9 controlled by a press control part 24, and the right ordinate indicates the intensities of ultrasonic waves vibrating the semiconductor light-emitting element 2 in a lateral direction parallel to the board surface of the mounting board 3. In FIG. 9B, the abscissa indicates time, and the ordinate indicates the detected luminance of the semiconductor light-emitting element 2 while being mounted. In FIG. 9C, the abscissa indicates time, and the ordinate indicates the detected chromaticity of the semiconductor light-emitting element 2 while being mounted. In FIGS. 9A to 9C, the time is denoted by $t_0$, $t_1$, and $t_2$ to clearly show the correspondence of timings.

As shown in FIG. 9A, the processing control unit 8 of the third embodiment presses the semiconductor light-emitting element 2 toward the mounting board 3 by the pressing mechanism 9 until the detected luminance reaches the target luminance value Ys of FIG. 9B.

After detecting that the detected luminance reaches the target luminance value Ys of FIG. 9B, the processing control unit 8 maintains the load of the pressing mechanism 9 at this point as shown in FIG. 9A. Further, after detecting that the detected luminance reaches the target luminance value Ys of FIG. 9B, the processing control unit 8 causes the ultrasonic-wave-applying mechanism 35 to generate ultrasonic vibrations as shown in FIG. 9A, thereby applying lateral vibrations to the semiconductor light-emitting element 2.

In joining under the lateral ultrasonic vibrations, there is no remarkable change in the contact area of the bump electrodes 26 with the electrodes 21 and little change in the heat dissipation properties of the semiconductor light-emitting element 2. Thus, as shown in FIG. 9B, the detected luminance exhibits extremely few fluctuations compared to the rate of change of load until the detected luminance reaches the target luminance value Ys. However, as shown in FIG. 9C, the detected chromaticity changes in one direction due to the ultrasonic lateral vibrations. The processing control unit 8 determines the completion of joining when the detected luminance reaches at least the target luminance value Ys and the detected chromaticity reaches the target chromaticity value Cs. Further, the processing control unit 8 instructs the ultrasonic-wave-applying mechanism 35 to turn off the ultrasonic output and the pressing mechanism 9 to take a load off.

The configuration of the third embodiment makes it possible to bring the detected luminance to at least the target luminance and bring the detected chromaticity closer to the target chromaticity. Thus, the configuration is particularly effective for the manufacturing of backlight for illuminating a liquid crystal display panel from behind.

INDUSTRIAL APPLICABILITY

The present invention is applicable to various apparatuses for manufacturing electronic equipment which require a semiconductor light-emitting element to be mounted on a board.

The invention claimed is:

1. A method for mounting a semiconductor light-emitting element, the method comprising:
supplying power to an electrode portion of a mounting board to allow a semiconductor light-emitting element to emit light while an electrode portion of the semiconductor light-emitting element and the electrode portion of the mounting board are joined to each other; and
detecting optical properties of the semiconductor light-emitting element while the element emits light and controlling the joining of the electrode portion of the semiconductor light-emitting element and the electrode portion of the mounting board based on the detected optical properties.

2. The method for mounting a semiconductor light-emitting element according to claim 1,
wherein the controlling of the joining comprises: controlling the joining with pressing; and then controlling the joining with ultrasonic waves.

3. The method for mounting a semiconductor light-emitting element according to claim 1, further comprising:
suctioning and retaining the semiconductor light-emitting element through a suction hole formed inside a pressing mechanism for pressing the semiconductor light-emitting element to the mounting board; and
detecting the optical properties of the semiconductor light-emitting element through the suction hole.

4. The method for mounting a semiconductor light-emitting element according to claim 1, further comprising:
suctioning and retaining the semiconductor light-emitting element through a suction hole formed inside a pressing mechanism for pressing the semiconductor light-emitting element to the mounting board; and
controlling the joining of the electrode portion of the semiconductor light-emitting element and the electrode portion of the mounting board, based on an additional value obtained by weighting first optical properties of the semiconductor light-emitting element, detected through the suction hole, and second optical properties of the semiconductor light-emitting element, detected through an optical waveguide formed by disposing a light-transmissive core material along an inner circumference of the suction hole-based on a ratio of light-receiving areas.

5. The method for mounting a semiconductor light-emitting element according to claim 1, wherein it is detected that the joining is completed when the detected optical properties exceed a threshold value inputted beforehand.

6. The method for mounting a semiconductor light-emitting element according to claim 1, wherein it is detected that the joining is excessive when the detected optical properties exceed a threshold value inputted beforehand and then drop below the threshold value.

7. A method for mounting a semiconductor light-emitting element, the method comprising:
supplying power to an electrode portion of a mounting board to allow a semiconductor light-emitting element to emit light while an electrode portion of the semiconductor light-emitting element and the electrode portion of the mounting board are joined to each other; and
detecting optical properties of the semiconductor light-emitting element while the element emits light, and completing the joining when detecting that chromaticity of the optical properties falls within a prescribed chromaticity range and luminance of the optical properties reaches at least prescribed luminance.

8. An apparatus for mounting a semiconductor light-emitting element comprising:
a pressing mechanism including a suction hole for suctioning a semiconductor light-emitting element, for pressing the suctioned semiconductor light-emitting element;
a stage holding a mounting board;
a power supply unit for supplying power to an electrode portion of the mounting board held by the stage;
an optical property detector for detecting optical properties of light from the suction hole; and
a processing control unit for controlling the pressing of the pressing mechanism based on a value detected by the optical property detector.

9. The apparatus for mounting a semiconductor light-emitting element according to claim 8, further comprising:
an mechanism for applying ultrasonic waves to the semiconductor light-emitting element;
wherein the processing control unit controls the pressing of the pressing mechanism or the ultrasonic waves applied by the ultrasonic-wave-applying mechanism based on the value detected by the optical property detector.

10. The apparatus for mounting a semiconductor light-emitting element according to claim 8, further comprising:
said optical detector as a first optical property detector for detecting optical properties of light from a suction hole; and
a second optical property detector for detecting optical properties of light from the optical waveguide;
wherein the processing control unit controls the pressing of the pressing mechanism based on values detected by the first optical property detector and the second optical property detector.

11. The apparatus for mounting a semiconductor light-emitting element according to claim 10, wherein the processing control unit controls the pressing of the pressing mechanism based on an additional value obtained by weighting the value detected by the first optical property detector and the value detected by the second optical property detector based on a ratio of light-receiving areas.

12. The apparatus for mounting a semiconductor light-emitting element according to claim 8, wherein a diameter of the suction hole is at least 0.05 mm.

13. The apparatus for mounting a semiconductor light-emitting element according to claim 8, wherein a diameter of the suction hole is not more than 0.2 times as large as a diagonal diameter of the semiconductor light-emitting element.

14. The apparatus for mounting a semiconductor light-emitting element according to claim 8, wherein a surface of the suction hole is coated with a coating material.

15. The apparatus for mounting a semiconductor light-emitting element according to claim 14, wherein the coating material is $SiO_2$ or $MgF_2$.

16. The apparatus for mounting a semiconductor light-emitting element according to claim 8, wherein a surface of the suction hole is mirror-finished.

\* \* \* \* \*